United States Patent [19]

McKinnon et al.

[11] Patent Number: 5,111,143

[45] Date of Patent: May 5, 1992

[54] MAGNETIC RESONANCE SPECTROSCOPY METHOD AND APPARATUS FOR PERFORMING THE METHOD

[75] Inventors: Graeme McKinnon, Zürich; Peter Bösiger, Ennetbaden, both of Switzerland

[73] Assignee: U.S. Philips Corporation, New York, N.Y.

[21] Appl. No.: 562,521

[22] Filed: Aug. 3, 1990

[30] Foreign Application Priority Data

Aug. 5, 1989 [DE] Fed. Rep. of Germany ....... 3925972

[51] Int. Cl.$^5$ ............................................. G01R 33/20
[52] U.S. Cl. ................................... 324/307; 324/309; 324/300
[58] Field of Search ................ 324/300, 307, 309, 318, 324/322

[56] References Cited

U.S. PATENT DOCUMENTS 4,868,503 9/1989 McKinnon et al. ................. 324/309
4,918,387 4/1990 McKinnon et al. ................. 324/309

OTHER PUBLICATIONS

A. Bax et al., "Separation of the Different Orders of NMR Multiple-Quantum Transitions By the Use of Pulsed Field Gradients", Chemical Physics Letters, vol. 69, No. 3, Feb. 1, 1980, pp. 567-570.

*Primary Examiner*—Michael J. Tokar
*Attorney, Agent, or Firm*—Jack D. Slobod

[57] ABSTRACT

A magnetic resonance spectroscopy method, and apparatus for performing the method, where a plurality of sequences act on an examination zone in the presence of a uniform, steady magnetic field, each sequence comprising at least three RF pulses, the distance between the first two RF pulses being equal to the reciprocal value of twice the scalar coupling constant J, between and after the pulses there being applied magnetic gradient fields having an amplitude and a duration such that the spin resonance signals occurring after the third RF pulse are determined exclusively by double quantum coherence. In order to suppress the fat component situated in the immediate vicinity of the lactate component of lower Larmor frequency, the lipid component at the area of the lactate component is reduced by making the second and/or the third RF pulse frequency-selective so that it acts as an 90° pulse for the component coupled to the lactate component and as a 0° pulse or 180° pulse for the component coupled to the lipid component.

20 Claims, 4 Drawing Sheets

FIG.8

MAGNETIC RESONANCE SPECTROSCOPY METHOD AND APPARATUS FOR PERFORMING THE METHOD

BACKGROUND OF THE INVENTION

1. Field of the Invention

The invention relates to a magnetic resonance spectroscopy method where a plurality of sequences act on an examination zone in the presence of a uniform, steady magnetic field, each sequence comprising at least three RF pulses, the distance between the first two RF pulses being equal to the reciprocal value of twice the scalar coupling constant J, between and after the pulses there being applied magnetic gradient fields having an amplitude and a duration so that spin resonance signals occurring after the third RF pulse are determined exclusively by double quantum coherence.

2. Description of the Related Art

A method of this kind is described by D. M. Freeman et al, SMRM Abstracts (San Francisco), 212 (1988) and by A. Bax et al, Chem. Phys. Lett., Vol. 69, No. 3, pp. 567-570 (1980). According to the known method, a magnetic gradient field is switched on and off before and after the last RF pulse. The time integral over this field after the last pulse exactly equals twice the corresponding integral before this pulse. It is thus achieved that only double quantum coherences influence the spin resonance signal. Single quantum coherences, notably the signals originating from water-bound protons, are then strongly suppressed.

In the publication by Freeman et al this method is used to determine the concentration of lactate independently of the concentration of fat or lipids. The Larmor frequencies of protons bound to fat and to lactate are very close to one another. In order to enable separation of these two components, a two-dimensional frequency spectrum is generated according to the known method. To this end, the so-called evolution time between the second and the third RF pulse is changed in steps, the spin resonance signals thus obtained being subjected to a two-dimensional Fourier transformation in order to obtain a two-dimensional frequency spectrum in which fat and lactate can be suitably separated from one another.

Two-dimensional frequency spectra require very long overall measuring periods and are susceptible to movements in the examination zone. Therefore, it would be useful to be able to determine the lactate concentration in a one-dimensional frequency spectrum independently of the fat concentration. This is hampered by the fact that one frequency component of lactate-bound protons is situated in the direct vicinity of the Larmor frequency of water-bound protons and that the other frequency component of lactate directly neighbours a fat component which is also present in the double quantum spectrum.

SUMMARY OF THE INVENTION

Therefore, it is the object of the present invention to provide a method of the kind set forth so that the lipid component which is substantially coincident with the lactate component in the frequency spectrum is substantially reduced.

This object is achieved in accordance with the invention in that, in order to reduce the lipid component at the area of the coupled lactate component, the second and/or the third RF pulse is frequency selective so that it acts as a 90° pulse for the component coupled to the lactate component and as a 0° pulse or 180° pulse for the component coupled to the lipid component.

The invention is based on the following considerations. In a sequence as used in the method described above, double quantum transitions can be excited by the second RF pulse. Such a double quantum transition itself does not cause a measurable spin resonance signal, but the third RF pulse brings this double quantum transition in a state in which it delivers a measurable signal. When the second and/or the third RF pulse is rendered frequency selective so that the component coupled to the lipid component does not "see" this pulse but the component coupled to the lactate component, double quantum states of the interfering lipid component will not be excited and/or not brought into a state in which they make a measurable contribution to the spin resonance signal arising as a result of these three RF pulses. Consequently, in the double quantum spectrum the frequency component which originates from fat and which registers substantially with the low-frequency component of lactate is suppressed to a high degree, so that the lactate concentration can be determined substantially without being influenced by the fat contents.

In a preferred version, the third RF pulse acts as a 90° pulse for the high-frequency lactate component and as a 180° pulse for the lactate component coupled thereto. Consequently, not only the lipid component in the double quantum spectrum is suppressed, but at the same time the amplitude of the lactate component in the spectrum is increased.

For medical examination of the human body it is important to select the volume to be spectroscopically covered. In a further version in accordance with the invention, this is realised in that for volume selection each sub-sequence comprises, subsequent to the three RF pulses, three further RF pulses which act as 180° pulses and which are associated with a respective magnetic gradient field, the gradients of the gradient fields activated for the three 180° pulses extending perpendicularly with respect to one another.

An alternative method is characterized in that for volume selection the first RF pulse, the RF pulse which is subsequently generated prior to the second pulse, and a fourth RF pulse which is preferably a 180° RF pulse and which succeeds the third pulse, are accompanied by magnetic gradient fields whose gradients extend perpendicularly with respect to one another.

For medical diagnostics it is becoming increasingly important to determine the spatial distribution of metabolites, notably of lactate. This is possible in a further version in that for the determination of the spatial lactate distribution, after the third RF pulse there is generated a fourth, preferably 180° RF pulse which is accompanied by a magnetic gradient field, that between the third and the fourth RF pulse their gradients extend perpendicularly with respect to one another and with respect to the gradient applied during the fourth RF pulse, and that upon repetition of the sequence the time integral of the gradient of at least one of the two gradient fields applied between the third and the fourth RF pulse is varied.

An apparatus for performing the method is characterized in that it comprises a magnet for generating a uniform, steady magnetic field, an RF coil system for generating RF signals and for receiving spin resonance signals, an RF transmitter for generating sequences which each comprise at least three RF pulses, the second or the third RF pulse thereof being frequency-selective so as to act as a 90° pulse for the lactate component and as a 0° pulse or a 180° pulse for the fat component, an RF receiver for receiving the spin resonance signals occurring each time after the third RF pulse, and means for determining the spectrum of the spin resonance signals.

BRIEF DESCRIPTION OF THE DRAWING

The invention will be described in detail hereinafter with reference to the drawing. Therein.

DETAILED DESCRIPTION OF THE PREFERRED EMBODIMENTS

Figure 1:
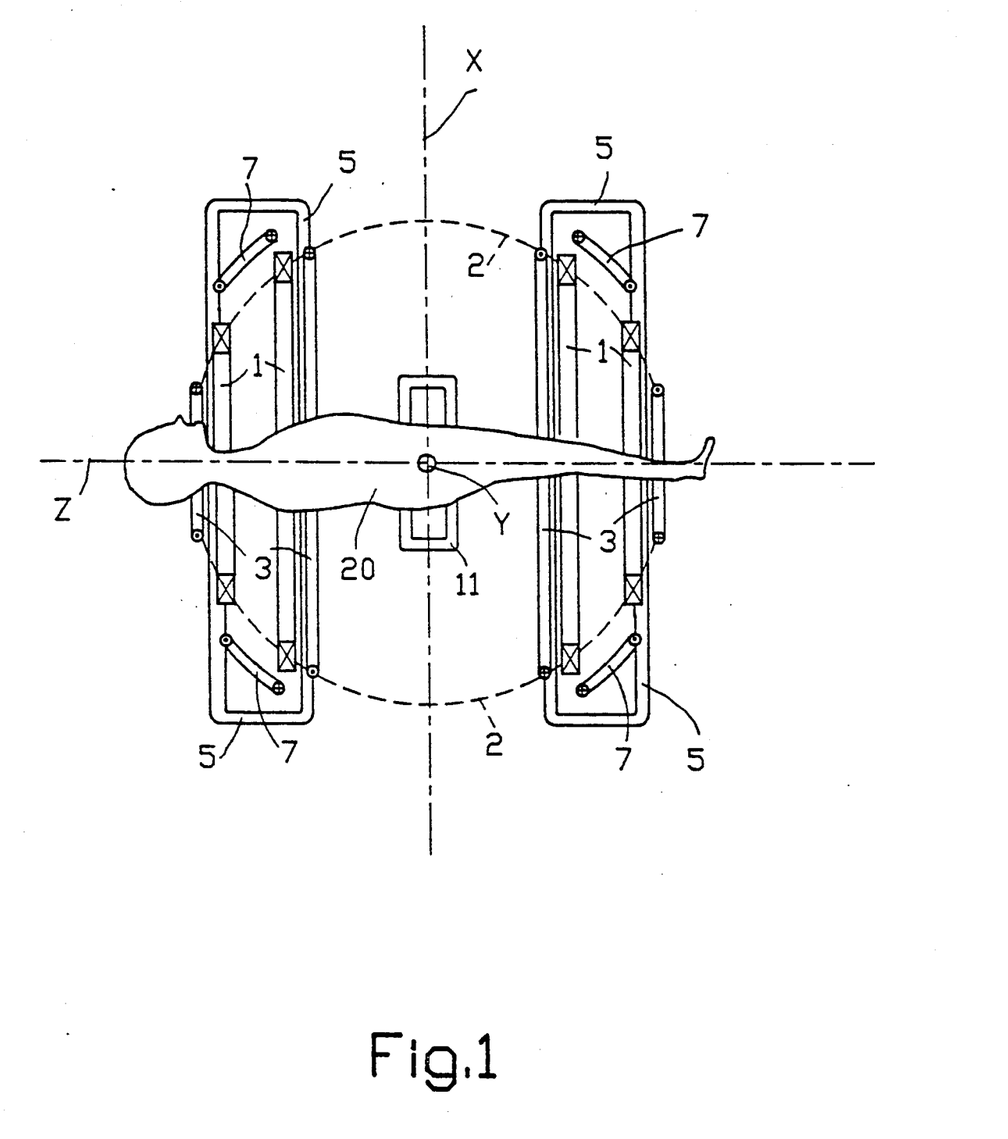
FIG. 1 shows a magnetic resonance tomography apparatus which is suitable for carrying out the invention.

The magnetic resonance examination apparatus shown in FIG. 1 comprises a system consisting of four coils 1 for generating a steady, uniform magnetic field which may be in the order of magnitude of from some tenths of T some T. This field extends in the z-direction of a cartesian coordinate system. The coils 1 are concentrically arranged with respect to the z-axis and may be provided on a spherical surface 2. The patient 20 to be examined is arranged within these coils.

In order to generate a magnetic field Gz which extends in the z-direction and which linearly varies in this direction there are provided four coils 3 which are preferably arranged on the same spherical surface. There are also provided four coils 7 which generate a gradient field Gx (i.e. a magnetic field whose strength varies linearly in one direction) which also extends in the z-direction but whose gradient extends in the x-direction. A magnetic gradient field Gy which extends in the z-direction and which has a gradient in the y-direction is generated by four coils 5 which may be identical to the coils 7 but which are arranged so as to be offset 90° in space with respect thereto. Only two of these four coils are shown in FIG. 1.

Because each of the three coil systems 3, 5 and 7 for generating the magnetic gradient fields Gz, Gy, Gx is symmetrically arranged with respect to the spherical surface 2, the field strength in the centre of the sphere, being at the same time the coordinate origin of said cartesian x-y-z coordinate system, is determined only by the steady, uniform magnetic field of the coil system 1.

Furthermore, an RF coil 11 is arranged symmetrically with respect to the plane z=0 of the coordinate system, which coil is constructed so that it generates an essentially uniform RF magnetic field which extends in the x-direction, i.e. perpendicularly with respect to the direction of the steady, uniform magnetic field. During each RF pulse the RF coil receives an RF, usually amplitude-modulated current from an RF generator.

Subsequent to the three RF pulses of each subsequence, the RF coil 11 serves to receive the spin resonance signal generated in the examination zone. Alternatively, however, a separate RF receiver coil may be used.

Figure 2:
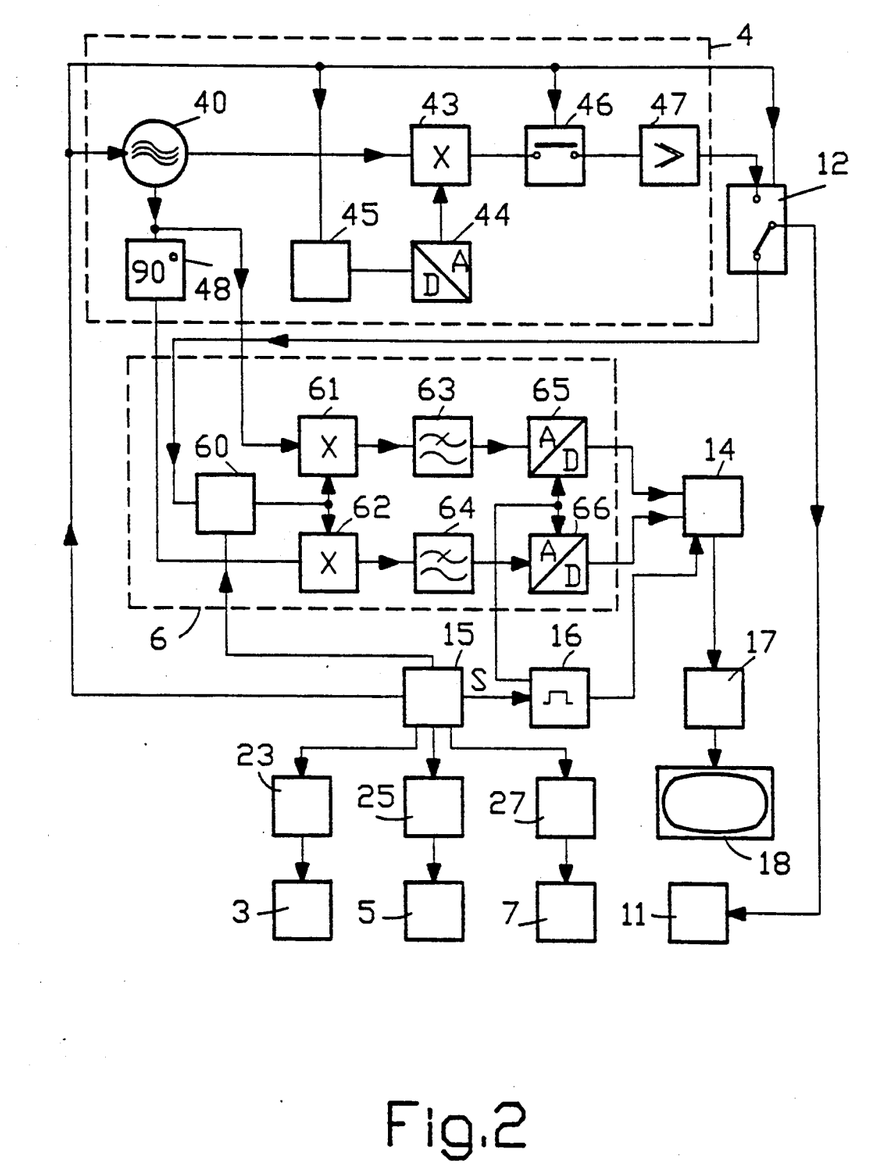
FIG. 2 shows a block diagram of such an apparatus.

FIG. 2 shows a simplified block diagram of this magnetic resonance examination apparatus. Via a switching device 12, the RF coil 11 is connected to an RF generator 4 on the one side and to an RF receiver 6 on the other side.

The RF generator 4 comprises an RF oscillator 40 whose frequency can be digitally controlled by a control device 15 and which produces oscillations of a frequency in the range of the Larmor frequency of the nuclei to be excited at the field strength produced by the coils 1. As is known, the Larmor frequency $f$ is calculated according to the relation $f = cB$, where B is the magnetic induction in the steady, uniform magnetic field and c is the gyromagnetic ratio which, for example for protons amounts to 42.56 MHz/T. The output of the oscillator 40 is connected to one input of a mixing stage 43. The mixing stage 43 receives a second input signal from a digital-to-analog converter 44 whose output is connected to a digital memory 45. Under the control of the control device 15, a series of digital data words representing an envelope signal, is read from the memory.

The mixing stage 43 processes the input signals applied thereto so that the carrier oscillation modulated with the envelope signal appears on its output. The output signal of the mixing stage 43 is applied, via a switch 46 which is controlled by the control device 15, to an RF power amplifier 47 whose output is connected to the switching device 12. The latter device is also controlled by the control device 15.

The receiver 6 comprises an RF amplifier 60 which is connected to the switching device and which receives the spin resonance signal each time induced in the RF coil 11, provided that the switching device occupies the corresponding position. The amplifier 60 comprises a muting input which is controlled by the control device 15 and via which it can be blocked so that the gain is substantially zero. The output of the amplifier is connected to the first inputs of two multiplying mixing stages 61 and 62, each of which supplies an output signal which corresponds to the product of its input signals. The second inputs of the mixing stages 61 and 62 receive a signal having the frequency of the oscillator 40, a phase shift of 90° existing between the signals on the two inputs. This phase shift is obtained by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via low-pass filters 63 and 64 which suppress the frequency supplied by the oscillator 40 as well as all higher frequencies and which conduct low-frequency components, to a respective analog-to-digital converter 65, 66. The latter converts the analog signals of the circuit 61 ... 64, constituting a quadrature demodulator, into digital data words which are applied to a memory 14. The analog-to-digital converters 65 and 66 and the memory 14 receive their clock pulses from a clock pulse generator 16 which can be blocked and enabled via a control lead by the control device 15, so that the signals supplied by the RF coil 11 and transposed to the low-frequency range can be converted into a series of digital data words for storage in the memory 14 only during a measuring interval defined by the control device. The data words or sampling values stored in the memory 14 are applied to an arithmetic device 17 which determines the spectral distribution of the nuclear magnetization therefrom by a way of a discrete Fourier transformation and which outputs the distribution thus determined to a suitable display unit, for example a monitor 18.

From current generators 23, 25 and 27 the gradient coil systems 3, 5 and 7 receive a respective current whose variation in time can be controlled by the control unit 15.

Figure 3:
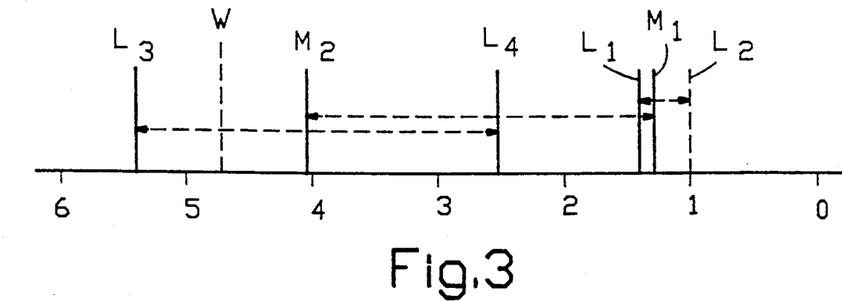
FIG. 3 shows a frequency diagram containing the relevant spectral components of fat, water and lactate.

FIG. 3 shows the position of the components which are of essential importance for the clinical detection of lactate on a frequency scale which shows the deviation with respect to the Larmor frequency of TMS (tetramethylsilane) (in ppm). The Larmor frequency of TMS is thus defined to be situated at zero. FIG. 3 shows, above the zero point, a line $L_2$ which originates from a $CH_3$ group of the fat molecule. This group is coupled to a $CH_2$ group which exhibits a frequency line $L_1$ at approximately 1.4 ppm. This scalar coupling is symbolized by the broken line between $L_1$ and $L_2$. When suitably excited, the molecular group associated with the line $L_1$ exhibits a double quantum transition, whilst for the line $L_2$ no such transition can be produced. Thus, the line $L_2$ disappears in the double quantum spectrum and hence is only represented by a broken line in FIG. 3.

In the direct vicinity of the line $L_1$ there is shown a line $M_1$ (at approximately 1.33 ppm) which originates from the $CH_3$ group of lactate. This $CH_3$ group is coupled to a CH group of the lactate molecule in a scalar fashion, the Larmor frequency of the latter being situated at 4.1 ppm. Both frequency lines appear in the double quantum spectrum. The frequency line W of water-bound protons is situated at approximately 4.7 ppm. These protons themselves cannot assume a double quantum state, which is why the frequency line W is also denoted by a broken line, but the water component whose intensity in biological tissues is several powers of ten greater than that of all other components cannot be fully suppressed and, therefore, this line also appears in the double quantum spectrum. Also shown are further lines $L_3$ and $L_4$ which originate from molecular groups of the fat molecule.

Even when it has been suppressed by a factor of, for example 1000 by means of a method of the kind set forth the water component W in biological tissue is still so strong, that the neighbouring lactate component $M_2$ in the double quantum spectrum cannot be separated therefrom. The lactate component $M_1$ is situated so near to the fat component $L_1$ that separate measurement is again impossible when the examination zone has a substantial fat content, for example muscular tissue. An unambiguous determination of the lactate content from a measurement of the component $M_1$, therefore, is possible only if the fat component $L_1$ whose frequency is very close to that of the component $M_1$ is strongly suppressed.

Figure 4:
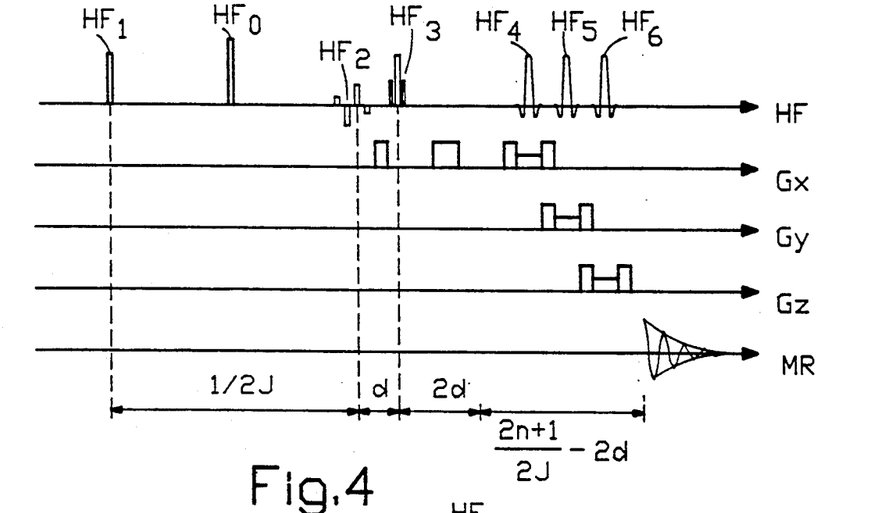
FIG. 4 shows the variation in time of the signals of a first volume-selective sequence.

This suppression is realised by means of a sequence whose variation in time is shown in FIG. 4. The first line of FIG. 4 shows the position in time of the magnetic RF pulses produced by the RF coil 11. The second, the third and the fourth line show the position in time of the magnetic gradient fields which are generated by the gradient coils 7, 5 and 3 and whose gradients $G_x$, $G_y$ and $G_z$, respectively, extend in the x-direction, the y-direction and the z-direction, respectively. The fifth line shows the spin resonance signal occurring. When this signal is detected, the control unit 15 enables the clock pulse generator 16 so that the spin resonance signals supplied by the RF coil 11 and transposed to the low-frequency range are converted into a series of digital data words which can be stored in the memory 14, after which they are subjected to a Fourier transformation.

The first RF pulse $HF_1$ is a 90° pulse which excites the frequency components shown in FIG. 3. The second RF pulse $HF_2$ is also a 90° pulse, at least for the lactate component $M_2$ situated at 4.1 ppm, and acts also on the components W and $L_3$. Its distance in time from the pulse $HF_1$ amounts to $\frac{1}{2}$ J, J being the scalar coupling constant of lactate or fat, so that a distance in time of 68 ms is obtained. Halfway between the pulses $HF_1$ and $HF_2$ there is situated a 180° RF pulse $HF_0$ which provides refocusing, thus increasing the amplitude of the spin resonance signal. The RF pulse $HF_0$ may have the same phase position as $HF_1$; however, it may also be phase shifted 90°, 180° or 270° with respect to $HF_1$.

The second 90° RF pulse $HF_2$ causes a double quantum transition for a part of the spins excited by the first RF pulse $HF_1$. The subsequent third RF pulse $HF_3$ brings inter alia these double quantum transitions in a state in which they can produce a measurable spin resonance signal. Between the second and the third RF pulse and briefly after the third RF pulse the magnetic gradient field Gx is applied, the absolute value of the time integral over this gradient field after the pulse $HF_3$ being exactly equal to twice the time integral over this field between the pulse $HF_2$ and the pulse $HF_3$. The signs of the gradient fields may be the same or opposed. In this case the effect of the gradient field Gx on the double quantum transitions is compensated for. All other transitions, for example also the single quantum transition of water, are suppressed.

For the suppression of the fat component $L_1$ which directly neighbours the lactate component $M_1$, various possibilities exist which may also be applied in combination with one another.

a) The second RF pulse is rendered frequency selective so that it brings the lactate components $M_1$, $M_2$ in a double quantum state, but not the fat component $L_1$. This is achieved by means of a frequency-selective RF pulse which acts as a 90° RF pulse for a frequency of 4.1 ppm (i.e. the frequency of the lactate component $M_2$ coupled to $M_1$) and which does not excite the frequency of 1 ppm, i.e. the frequency of the fat component $L_2$ coupled to $L_1$. Generally, such a frequency-selective pulse produces a given excitation for the components $L_1$ and $M_1$ neighbouring $L_2$. The excitation of $L_1$, however, does not cause a double quantum transition for as long as $L_2$ is not excited. The excitation of $M_1$ supports the formation of double quantum transitions but is not required for that purpose; it would be sufficient to excite only $M_2$.

b) When the third RF pulse is frequency-selective in the same way as described above for the second RF pulse, any double quantum transitions of the fat component $L_1$ would not be brought in a state in which they generate a spin resonance signal or make contribution thereto. It is even more attractive, however, to use the following alternative: the third RF pulse $M_2$ is conceived so that it acts as a 90° pulse for the frequency of the component $M_2$ (4.1 ppm), but as a 180° pulse for the frequency of the component $M_1$ (1.33 ppm). It can be demonstrated that in this case a second component of the nuclear magnetization of $M_2$ is brought from a double quantum state into a single coherence state in which it also makes a contribution to the spin resonance to be observed. The amplitude of the signal at $M_2$ is thus doubled. Because the flip angle of the third RF pulse around $M_1$ cannot change abruptly, the third RF pulse also acts substantially as a 180° pulse for the fat components $L_1$ and $L_2$ whose frequency neighbours that of $M_1$. Because the fat component $L_2$, consequently, does not "see" a 90° pulse but a 180° pulse, any double quantum coherence states will not be brought into an (observable) quantum coherence state.

The possibilities described sub a) and b) can be individually applied; preferably, however, the two possibilities are combined.

Figure 5:
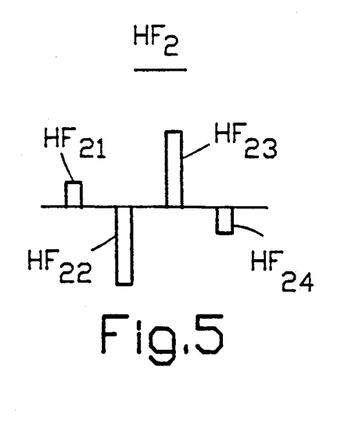
FIG. 5 shows the variation in time of the second RF pulse.

The frequency-selective RF pulse $HF_2$ required for the suppression of the fat component in accordance with a) is shown in FIG. 5. It concerns a so-called binomial RF pulse. As is known, a binomial RF pulse consists of a series of sub-pulses whose associated flip angles (being the angle wherethrough the nuclear magnetization is rotated out of the rest state by such a sub-pulse) relate to one another in the same way as the binomial coefficients. The distance in time between two successive sub-pulses is chosen so that an oscillation whose frequency corresponds to the difference between the frequency to be excited and the frequency to be suppressed has changed its phase by exactly 180° or an odd multiple thereof during this period of time. The central frequency of this sub-pulse coincides with one of the previously mentioned frequencies.

Accordingly, FIG. 5 shows the RF pulse $HF_2$ as a 1, $-3$, 3, $-1$ RF pulse which consists of the four sub-pulses $HF_{21} \ldots HF_{24}$. The central frequency of each of these RF pulses corresponds to the Larmor frequency of the fat component of $L_2$, i.e. it is situated at approximately 1 ppm. The first sub-pulse $HF_{21}$ and the third sub-pulse $HF_{23}$ have the same phase position as the first 90° pulse $HF_1$. The second and the fourth sub-pulse, $HF_{22}$ and $HF_{24}$, respectively, have the opposite phase position with respect to the former sub-pulses. The distance in time between each time two successive RF pulses amounts to $(2 \, df)^{-1}$, where df is the difference frequency between $M_2$ and $L_2$; for a magnetic flux density of the uniform steady magnetic field of 2T, a distance of approximately 1.9 ms is then obtained between the sub-pulses. The first and the last sub-pulses have a flip angle of each time 11.25°, the flip angle of the RF pulses $HF_{22}$ and $HF_{23}$ being three times larger. For nuclear spins whose Larmor frequency corresponds to the central frequency of the sub-pulses (such as, for example for $L_2$), the effects of the RF pulses $HF_{21}$ and $HF_{24}$ or $HF_{22}$ and $HF_{23}$ compensate for one another. For the component $M_2$, however, the effect of the pulses $HF_{21} \ldots HF_{24}$ is summed, so that the flip angles associated with the individual sub-pulses are added for this component and the effect of a 90° RF pulse is obtained. Because the component $L_2$ coupled to the component $L_1$ is thus not excited, the second RF pulse does not cause a double quantum transition for the component $L_1$; thus, $L_1$ is suppressed in the double quantum spectrum.

The sub-pulses $HF_{22}$ and $HF_{24}$ may also occupy the same phase position as the sub-pulses $HF_{21}$ and $HF_{23}$ or the RF pulse $HF_1$. In that case the central frequency of these sub-pulses must coincide with the frequency of the component $M_2$.

Figure 6:
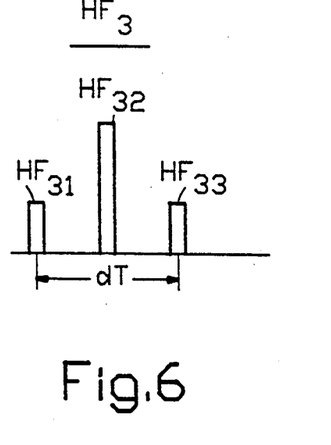
FIG. 6 shows the variation in time of the third RF pulse.

FIG. 6 shows a version of the RF pulse $HF_3$ which satisfies the conditions mentioned sub b). The RF pulse $HF_3$ then comprises two identical 45° sub-pulses $HF_{31}$ and $HF_{33}$ wherebetween a "hard" and hence broadband 90° sub-pulse $HF_{32}$ is situated in the centre. For the distance in time dt between the two sub-pulses $HF_{31}$ and $HF_{33}$ the relation $dt = n/(2df)$ is applicable. Therein, n is an integer positive odd number and df is the frequency difference between the Larmor frequencies of the components $M_1$ and $M_2$ (approximately 235 Hz for a steady field of 2T). When the central frequency of the sub-pulses $HF_{31}$ and $HF_{33}$ coincides with the Larmor frequency of the lactate component $M_1$, all sub-pulses $HF_{31} \ldots HF_{33}$ must have the same phase position as the RF pulses $HF_1$ and $HF_0$. The effects of the sub-pulses $HF031$ and $HF_{33}$ then compensate one another for the lactate component $M_2$ and are summed for the lactate component $M_1$ so that the latter experiences these two sub-pulses as 90° pulses. In addition, the sub-pulse $HF_{32}$ acts on said components and all other components of FIG. 3. The RF pulse $HF_3$ thus acts as a 90° pulse for the component $M_2$ and as a 180° pulse for the component $M_1$; as described sub b), the amplitude of the double quantum transition $M_1$ in the spin resonance signal is this doubled.

It is also possible to choose the central frequency of the sub-pulses $HF_{31}$ and $HF_{33}$ in accordance with the frequency component $M_2$ (4.1 ppm). In this case the phase of the sub-pulse $HF_{31}$ must lead the phase of the RF pulse $HF_1$ by 90° and the phase of $HF_{33}$ must lag by 90°; the phase of $HF_{32}$ must be the same as that of $HF_1$.

The frequency dependency of the flip angle of $HF_3$ between $M_2$ and $M_1$ varies cosinusoidally from 90° to 180°. Consequently, the flip angle is approximately 180° for the fat components $L_1$ and $L_2$ whose frequency is comparatively close to $M_1$. Because the component $L_2$ does not "see" a 90° pulse, any double quantum transitions at the fat component $L_1$ are brought in a single quantum state, be it to a negligibly small extent, in which they can be observed.

The nuclear spin systems brought in a single quantum state from a double quantum state by the third RF pulse $HF_3$ produce a spin resonance signal which reaches its maximum value at an instant $(2n+1)/(2J)$ after the third RF pulse $HF_3$, where n is an integer number larger than or equal to zero. At that instant the sampling of the spin resonance signal shown on the fifth line of FIG. 4 commences, i.e. the control unit 15 then enables the clock pulse generator 16 so that the analog signals are digitized and stored, after which they are subjected to a Fourier transformation wherefrom the double quantum spectrum is obtained. In this spectrum the water line is at least a factor 1000 smaller and the intensity of the fat component $L_1$ is a factor of approximately 500 lower. During the execution of the sub-sequences the distance in time between the RF pulses $HF_2$ and $HF_3$ should be as small as possible, but still large enough to enable the switching on and off therebetween of a magnetic gradient field used to suppress the undesirable spectral components.

For clinical applications it is usually not necessary to determine the lactate content throughout the entire examination zone but only in a limited part thereof, for example a human organ or a part thereof. Therefore, it is necessary to select the volume to be spectroscopically examined. To this end, excitation methods are known in which the pulses required for selection are generated before or during the spectroscopic examination. However, the spectroscopic experiment is adversely affected thereby.

In accordance with the invention, the selection takes place after the third RF pulse, using three slice-selective 180° RF pulses $HF_4$, $HF_5$ and $HF_6$, each of which is accompanied by one of the three magnetic gradient fields Gx, Gy and Gz as shown in FIG. 4. Thus, a volume is selected whose dimensions depend on the bandwidth of the RF pulses $HF_4 \ldots HF_6$ and also on the strength of the magnetic gradient field during these pulses. This sub-sequence, comprising the 180° pulses $HF_4 \ldots HF_6$ required for selection, acts after the RF pulse $HF_3$ and before the spin resonance signal reaches its maximum. The distance in time between this sub-sequence and the pulse $HF_3$ must at least amount to 2d, where d is the distance between the RF pulses $HF_2$ and $HF_3$. The sub-sequence should be situated at the centre of the interval commencing at the instant 2d and terminating at the instant $(2n+1)/(2J)$ after the third RF pulse. With respect to the selected volume element, the three slice-selective RF pulses $HF_4 \ldots HF_6$ act as a single 180° pulse whose position in time corresponds, for the same distance between the RF pulses, to that of the second 180° RF pulse ($HF_5$) and which refocuses the nuclear magnetization in the volume element again, however without influencing the spin-spin interactions and the quantum coherences.

Figure 7:
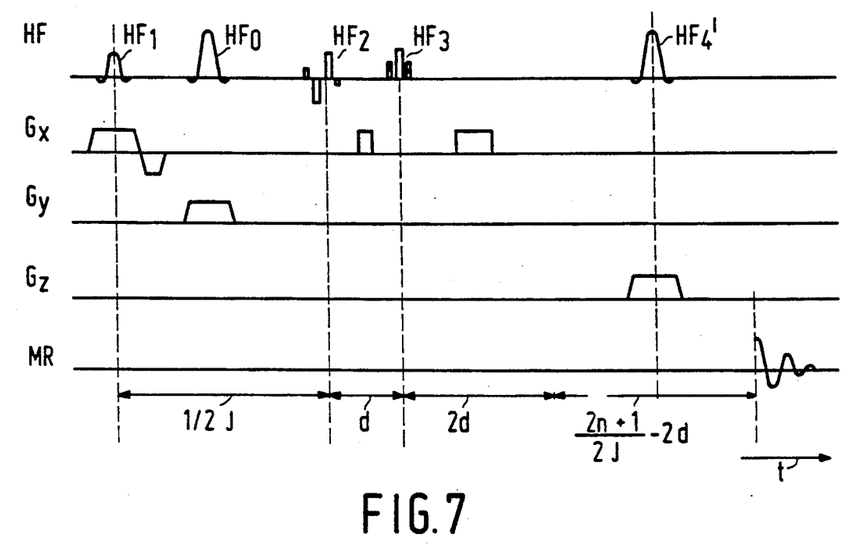
FIG. 7 shows the variation in time of the signals in an alternative volume-selective sequence.

FIG. 7 shows an alternative volume-selective sequence. It corresponds essentially to that shown in FIG. 4, be it that instead of the three RF pulses $HF_4 \ldots HF_6$ only a single RF pulse $HF_4'$, accompanied by a magnetic gradient field (Gz) is generated; additionally, the RF pulses $HF_1$ and $HF_0$ are also rendered slice-selective by an accompanying magnetic gradient field. The gradients of the magnetic gradient fields accompanying the three RF pulses $HF_1$, $HF_0$ and $HF_4'$ extend perpendicularly with respect to one another.

Figure 8:
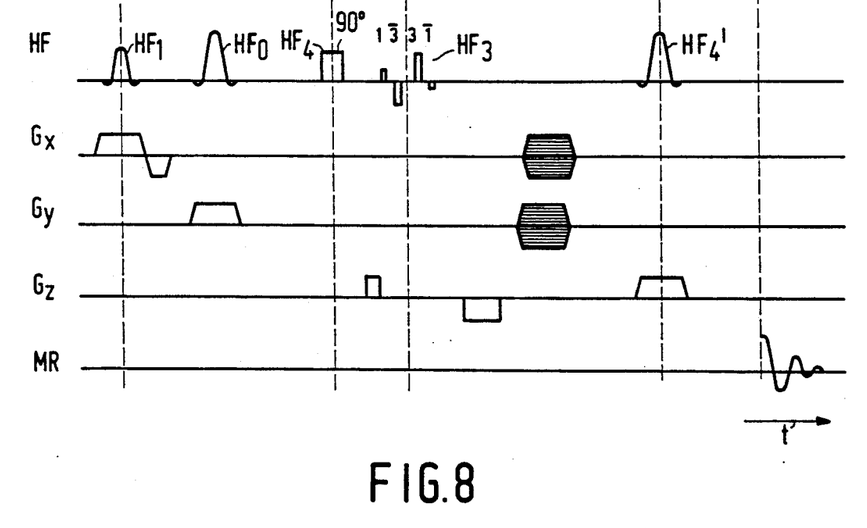
FIG. 8 shows a lactate imaging sequence.

FIG. 8 shows a modified sequence which enables lactate imaging, i.e. the determination of the spatial distribution of lactate in a slice of the examination zone. Each sequence then comprises the four RF pulses $HF_1$, $HF_0$, $HF_2$ and $HF_3$, which exhibit the same variation in time when the sequence is repeated. This variation may correspond to that shown in FIG. 4, but alternatively one of the two RF pulses $HF_2$ or $HF_3$ may be non-frequency selective. These pulses are succeeded by a further RF pulse $HF_4'$ which is conceived as a 180° pulse. Its position in time corresponds, for example to that of the RF pulse $HF_5$ in the sequence shown in FIG. 4. Single quantum coherences are again suppressed in that between $HF_2$ and $HF_3$ a magnetic gradient field $G_z$ is switched on and off and in that the same magnetic gradient field is switched on and off again after $HF_3$, the absolute value of the time integral over this gradient field after $HF_3$ being equal to twice that between $HF_2$ and $HF_3$.

For phase encoding purposes magnetic gradient fields (Gx, Gy) are switched on between $HF_3$ and $HF_4'$, the time integral over each of these gradient fields being varied during repetitions of the sequence, for example in each time 128 steps, so that in total 128×128 repeats are required. The spin resonance signal refocused by the pulse $HF_4'$ is digitized, stored and subjected to a two-dimensional Fourier transformation wherefrom an image of the lactate distribution is obtained in the slice determined by the RF pulse $HF_4$ in conjunction with the accompanying gradient field.

We claim:

1. A magnetic resonance spectroscopy method where a plurality of sequences act on an examination zone in the presence of a uniform, steady magnetic field, each sequence comprising at least first, second and third RF pulses ($HF_1 \ldots HF_3$), the distance in time between the first and second RF pulses ($HF_1$, $HF_2$) being equal to the reciprocal value of twice a scalar coupling constant (J), after the second and the third RF pulses ($HF_2$, $HF_3$) there being applied magnetic gradient fields (Gx) having amplitude and duration so that spin resonance signals occurring after the third RF pulse are exclusively due to double quantum coherence, characterized in that in order to reduce a first lipid spectral component ($L_1$) at the area of a first lactate component ($M_1$), the second and/or the third RF pulse ($HF_2$, $HF_3$) is frequency selective so that it acts as a 90° pulse for a second lactate spectral component ($M_2$) coupled to the first lactate spectral component ($M_1$) and as a 0° pulse or a 180° pulse for a second lipid spectral component ($L_2$) coupled to the first lipid spectral component ($L_1$).

2. A magnetic resonance spectroscopy method as claimed in claim 1, characterized in that the RF pulses ($HF_1$) which are not frequency selective are 90° pulses.

3. A method as claimed in claim 1, characterized in that a 180° pulse ($HF_0$) is generated halfway between the first and second RF pulses ($HF_1$, $HF_2$).

4. A method as claimed in claim 1, characterized in that the second RF pulse ($HF_2$) is a binomial RF pulse which acts as a 90° pulse at 4.1 ppm. deviation relative to the Larmor frequency of tetramethylsilane and is ineffective a 1 ppm deviation.

5. A method as claimed in claim 1, characterized in that the third RF pulse acts as a 90° pulse for the first or second lactate component having the higher frequency and as a 180° pulse for the other lactate component.

6. A method as claimed in claim 1, characterized in that the third RF pulse ($HF_3$) consists of three sub-pulses, the second of which is a broadband 90° pulse ($HF_{32}$), the first and the third pulses being binomial 45° pulses ($HF_{31}$, $HF_{33}$) which are ineffective at 4.1 ppm deviation relative to the Larmor frequency of tetramethylsilane and act as a 90° pulse at 1.33 ppm deviation.

7. A method as claimed in claim 3, characterized in that for volume selection the first RF pulse ($HF_1$), the subsequent RF pulse ($HF_0$), and a fourth RF pulse ($HF_4'$) succeeding the third pulse ($HF_3$) are accompanied by magnetic gradient fields (Gx, Gy, Gz) whose gradients extend perpendicularly with respect to one another.

8. A method as claimed in claim 1, characterized in that for the determination of the spatial lactate distribution, after the third RF pulse ($HF_3$) there is generated a fourth RF pulse ($HF_4'$) which is accompanied by a magnetic gradient field (Gz), that between the third and fourth RF pulses ($HF_3$, $HF_4'$) two magnetic gradient fields are applied having gradients which extend perpendicularly with respect to one another and with respect to the gradient of the magnetic gradient field applied during the fourth RF pulse ($HF_4'$), and that upon repetition of the sequence the time integral of the gradient of at least one of the two magnetic gradient fields applied between the third and fourth RF pulses is varied.

9. A method as claimed in claim 1, characterized in that for volume selection each sub-sequence comprises, subsequent to the three RF pulses ($HF_1 \ldots HF_3$), three further RF pulses ($HF_4 \ldots HF_6$) which act as 180° pulses and which are accompanied by a respective magnetic gradient field (Gx, Gy, Gz), the gradients of the gradient fields applied for the three 180° pulses extending perpendicularly with respect to one another.

10. An apparatus for performing magnetic resonance spectroscopy comprising: a magnet means (1) for generating a uniform, steady magnetic field, an RF coil system means (11) for transmitting RF signals and for receiving spin resonance signals, and RF generator means (4) for generating said RF signals, for supply to said RF coil system means, in sequences which each comprise at least first, second and third RF pulses ($HF_1 \ldots HF_3$), the distance in time between the first and second RF pulses ($HF_1$, $HF_2$) being equal to the reciprocal value of twice a scalar coupling constant (J), and that, in order to reduce a first lipid spectral component ($L_1$) at the area of a first lactate spectral component ($M_1$), the second RF pulse ($HF_2$) or the third RF pulse ($HF_3$) thereof is frequency selective so as to act as a 90° pulse for a second lactate spectral component ($M_2$) coupled to the first lactate spectral component ($M_1$) and is a 0° pulse or a 180° pulse for a second lipid spectral component ($L_2$) coupled to the first lipid spectral component ($L_1$), means including gradient coil means for generating gradient magnetic fields (Gx) after, said second and said third RF pulses ($HF_2$, $HF_3$) having amplitude and duration so that spin resonance signals occurring after the third RF pulse ($HF_3$) are exclusively due to double quantum coherence, an RF receiver (6) for detecting the spin resonance signals, received by said RF coil system means, after the third RF pulse ($HF_3$), and means (17) for determining the spectrum of the detected spin resonance signals.

11. A method as claimed in claim 2, characterized in that a 180° pulse ($HF_0$) is generated halfway between the first and second RF pulses ($HF_1$, $HF_2$).

12. A method as claimed in claim 2, characterized in that the second RF pulse ($HF_2$) is a binomial RF pulse which acts as a 90° pulse at 4.1 ppm deviation relative to the Larmor frequency of tetramethylsilane and is ineffective at 1 ppm deviation.

13. A method as claimed in claim 11, characterized in that the second RF pulse ($HF_2$) is a binomial RF pulse which acts as a 90° pulse at 4.1 ppm deviation relative to the Larmor frequency of tetramethylsilane and is ineffective at 1 ppm deviation.

14. A method as claimed in claim 2, characterized in that the third RF pulse acts as a 90° pulse for the first or second lactate component having the higher frequency and as a 180° pulse for the other lactate component.

15. A method as claimed in claim 13, characterized in that the third RF pulse acts as a 90° pulse for the first or second lactate component having the higher frequency and as a 180° pulse for the other lactate component.

16. A method as claimed in claim 2, characterized in that the third RF pulse ($HF_3$) consists of three subpulses, the second of which is a broadband 90° pulse ($HF_{32}$), the first and third pulses being binomial 45° pulses ($HF_{31}$, $HF_{33}$) which are ineffective at 4.1 ppm deviation relative to the Larmor frequency of tetramethylsilane and act as a 90° pulse at 1.33 ppm deviation.

17. A method as claimed in claim 15, characterized in that the third RF pulse ($HF_3$) consists of three subpulses, the second of which is a broadband 90° pulse ($HF_{32}$), the first and third pulses being binomial 45° pulses ($HF_{31}$, $HF_{33}$) which are ineffective at 4.1 ppm deviation and act as a 90° pulse at 1.33 ppm deviation.

18. A method as claimed in claim 2, characterized in that for volume selection the first RF pulses ($HF_1$), the subsequent RF pulse ($HF_0$), and a fourth RF pulse ($HF_{4'}$) succeeding the third ($HF_3$) pulse are accompanied by magnetic gradient fields (Gx, Gy, Gz) whose gradients extend perpendicularly with respect to one another.

19. A method as claimed in claim 17, characterized in that for volume selection the first RF pulse ($HF_1$), the subsequent RF pulse ($HF_0$), and a fourth RF pulse ($HF_{4'}$) succeeding the third pulse ($HF_3$) are accompanied by magnetic gradient fields (Gx, Gy, Gz) whose gradients extend perpendicularly with respect to one another.

20. A method as claimed in claim 19, characterized in that for the determination of the spatial lactate distribution, after the third RF pulse ($HF_3$) there is generated a fourth RF pulse ($HF_{4'}$) which is accompanied by a magnetic gradient field ($G_z$), that between the third and fourth RF pulses two magnetic gradient fields are applied having gradients which extend perpendicularly with respect to one another and with respect to the gradient of the magnetic gradient field applied during the fourth RF pulse ($HF_{4'}$), and that upon repetition of the sequence the time integral of the gradient of at least one of the two magnetic gradient fields applied between the third and fourth RF pulses is varied.

* * * * *